United States Patent
Wagner et al.

(10) Patent No.: US 6,965,116 B1
(45) Date of Patent: Nov. 15, 2005

(54) METHOD OF DETERMINING DOSE UNIFORMITY OF A SCANNING ION IMPLANTER

(75) Inventors: Dennis W. Wagner, San Jose, CA (US); Biagio Gallo, Palo Alto, CA (US); Peter Torin Kindersley, Horsham (GB); David Eugene Aberle, Milpitas, CA (US); Jonathon Yancey Simmons, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 10/897,424

(22) Filed: Jul. 23, 2004

(51) Int. Cl.[7] ..................... H01J 37/317; H01J 37/256
(52) U.S. Cl. .................. 250/492.21; 250/492.1; 250/492.3; 250/397; 250/398; 438/961
(58) Field of Search .................. 250/492.21, 492.1, 250/492.3, 397, 398; 438/961

(56) References Cited

U.S. PATENT DOCUMENTS

| | | | |
|---|---|---|---|
| 4,234,797 A | 11/1980 | Ryding | |
| 4,539,217 A | 9/1985 | Farley | |
| 4,587,433 A | 5/1986 | Farley | |
| 5,641,969 A | 6/1997 | Cooke et al. | |
| 5,760,409 A * | 6/1998 | Chen et al. | 250/492.21 |
| 5,898,179 A | 4/1999 | Smick et al. | |
| 6,297,510 B1 * | 10/2001 | Farley | 250/492.21 |
| 6,555,825 B1 | 4/2003 | Lowe et al. | |
| 6,608,316 B1 | 8/2003 | Harrison | |
| 6,646,276 B1 | 11/2003 | Mitchell et al. | |
| 2004/0058513 A1 * | 3/2004 | Murrell et al. | 438/535 |

FOREIGN PATENT DOCUMENTS

| | | |
|---|---|---|
| WO | 03088303 | 10/2003 |
| WO | 2004001789 | 12/2003 |

* cited by examiner

*Primary Examiner*—Nikita Wells
(74) *Attorney, Agent, or Firm*—Boult Wade Tennant

(57) ABSTRACT

Dose uniformity of a scanning ion implanter is determined. A base beam current is measured at the beginning and/or the end of a complete scan over the whole substrate area. This base beam current is measured at a time when the measurement should be unaffected by outgassing from a substrate being implanted and a base dose distribution map is then calculated for the scan in question. During the scan itself beam instability events are detected and the magnitude and position in the scan of the detected instability events is measured. Corresponding deviations in the calculated base dose map are determined and subtracted from the previously calculated base dose distribution map to provide a corrected distribution map. By determining overall dose uniformity substractively in this way, good overall accuracy can be obtained with lesser accuracy in the measurement of the beam instability events.

26 Claims, 6 Drawing Sheets

METHOD OF DETERMINING DOSE UNIFORMITY OF A SCANNING ION IMPLANTER

FIELD OF THE INVENTION

This invention is concerned with ion implanters and in particular with methods for determining ion dose uniformity over a substrate being implanted by such implanters.

BACKGROUND OF THE INVENTION

Ion implanters are used to modify semiconductor substrate material by implanting ions of a desired species into the substrate, thereby altering the properties of the substrate.

Ion implantation takes place in a vacuum chamber, in which a substrate or wafer, into which ions are to be implanted, is mounted on a holder. Ions are usually directed from an ion source towards the substrate in the form of a beam, and the beam cross-sectional area is usually smaller than the wafer to be implanted. In order to implant evenly over the entire surface of the substrate wafer, some relative scanning between the substrate and the beam is provided.

Various scanning arrangements have been proposed and used in the prior art, including two-dimensional beam scanning with the substrate wafer held still on the holder, hybrid scanning in which the beam is scanned in a first direction whilst the wafer is mechanically passed through the scanned beam in a second direction, and mechanical scanning in which the beam is maintained substantially steady and the substrate is mechanically scanned in two dimensions. Examples of mechanical and hybrid scanning arrangements include U.S. Pat. No. 5,641,969, U.S. Pat. No. 5,898,179, U.S. Pat. No. 6,555,825, WO 03/088303 and WO 2004/001789.

It is a usual objective in ion implantation to ensure that a desired dosage of the desired species is delivered uniformly over the surface of the or each substrate wafer being implanted. The total dose per unit area being delivered to the substrate must also usually be carefully controlled. To this end, the current of ions in the ion beam is measured and the scanning arrangement is adjusted to ensure each part of the wafer is exposed to the beam for an appropriate period of time so as to receive the desired total dose.

Beam current is usually measured by means of a faraday collector. This device ensures that secondary electrons which may be generated when beam ions impinge on a collection surface, are not allowed to escape the measuring device, so that the charge collected by the faraday collector is a correct measurement of the total number of ions collected.

Unfortunately, the current of desired ions delivered to the wafer in the beam of a typical implanter is not completely constant. The beam current may experience relatively slow drift, and additionally may experience sudden and short term changes. These short term changes, typically referred to as glitches, may be the result for example of an arcing event at some location along the beam line. Whereas the slow drift of ion beam current may result in a change in current of a few percentage points over many minutes, glitches typically have a fast onset, a duration up to a few hundred milliseconds, and a fast recovery. Ideally, it would be desirable to monitor accurately the current of ions in the beam throughout the implant process. However, it has proved impracticable to make a continuous and reliable current reading of beam ions impinging on the substrate during the implant process, so that in practice only those ions which bypass the substrate during the scanning procedure can be effectively monitored with a faraday collector located behind the substrate holder.

However, various techniques have been proposed for obtaining ion beam current readings at intervals during an implant process. For example, U.S. Pat. No. 4,234,797 discloses a batch implanter using a scan wheel having a number of substrates mounted around the periphery of the wheel. The substrates are mechanically scanned through the beam by rotation of the wheel and simultaneously translating the wheel axis. A slot is provided in the wheel between a pair of adjacent substrate supports to allow beam ions to pass through the wheel as the slot passes over the beam during rotation of the wheel. In this way, a measure of beam current can be obtained once each wheel rotation. U.S. Pat. No. 6,646,276 discloses a scan wheel formed of multiple substrate supports carried on spokes so that there are spaces between each adjacent pair of supports. This patent also discloses taking ion beam measurements throughout the implant process as the wheel is scanned through the beam. The beam current is sampled at a sufficiently fast rate to obtain values of the current of beam ions passing between adjacent wafer supports and spokes of the scan wheel.

An additional problem with obtaining an accurate measure of beam current during the ion implantation process is that the faraday collector used to monitor beam current can only detect and respond to charged particles in the beam. There is a tendency for beam ions to become neutralised primarily by charge exchange events with residual gas atoms in the region through which the beam passes before impinging upon the substrate to be implanted. The presence of neutralised atoms or molecules of the desired species in the beam impinging upon the substrate is not a problem, provided the beam ions became neutralised only after they had achieved the final desired energy and beam direction towards the substrate to be implanted. However, the presence of neutralised particles in the ion beam does present a problem for obtaining accurate measurements of beam current, since neutral particles will not be measured.

It has been understood for many years that the proportion of neutral particles in the ion beam is related to the pressure of residual gas through which the ion beam passes before impinging on the substrate. A steady state background residual gas pressure in the evacuated chamber in which ion implantation is conducted can be tolerated, since the resulting proportion of neutral particles in the ion beam is likely to remain substantially constant and can be corrected for empirically, e.g. by a scalar multiplier. However, the implantation process on a substrate wafer causes material, typically photoresist used for masking the wafer, to outgas from the wafer surface. This results in an unpredictable increase in the residual gas pressure in the process chamber, with consequent increase in the proportion of neutral particles in the ion beam. As a result, ordinary measurements of ionic current received by a faraday, taken during the time when the substrate is being scanned relative to the ion beam, will tend to under measure the beam current by an unpredictable amount. As a result, the total dose of desired species implanted in the substrate by the process becomes unpredictable.

Various proposals have been made to counteract the effect on beam current measurement of variations in the residual gas pressure caused by outgassing during implantation. For example, U.S. Pat. No. 6,297,510 discloses monitoring the residual gas pressure in the process chamber of an ion implanter whilst making multiple beam current measurements between process scans, in order to apply a computed correction to the measured beam current. Arrangements for correcting measured beam current during scanning, which involve obtaining residual gas pressure measurements, are also disclosed in U.S. Pat. No. 4,539,217, U.S. Pat. No. 4,587,433 and U.S. Pat. No. 5,760,409.

The increase in residual gas pressure resulting from outgassing during the implant process is reduced again by the vacuum pumping system quite quickly once outgassing ceases, e.g. once the substrate is no longer being scanned through the ion beam. Accordingly, ion current measurements taken before and after a scanning process can be reliably accurate, so long as sufficient time is allowed for residual gas pressure to be pumped back down to the nominal value. Accordingly, it has been established practice with batch implanters using a scan wheel to make accurate beam current measurements during an implant process each time the scan wheel axis is at one extreme of its reciprocating motion at which the substrate holders and substrates thereon are spinning completely clear of the ion beam. So long as the scan is paused in this position for a sufficient time for the vacuum system to reduce the residual gas pressure back to nominal, an accurate beam current reading can then be taken. This procedure allows a fresh and accurate beam current measurement to be taken at intervals of a few seconds through an implant process. The implant process may comprise multiple reciprocations of the wheel axis passing the substrates mounted on the wheel periphery repeatedly through the ion beam, while the scan wheel is rotated at a fast rate, typically 200–1250 rpm. Thus, rotation of the scan wheel causes the beam to sweep repeatedly over each substrate at a fast rate (approximately every 50 millisecond), while these fast sweeps over the substrate pass radially over the substrate with reciprocation of the wheel axis at a slower repetition rate (typically a few seconds). These repeated beam current measurements during an implant process can be sufficient to allow the process to be controlled to compensate for slow changes in the beam current resulting from drift of ion source parameters for example. However, these accurate beam current readings taken at the end of each slow scan do not normally detect short term glitches of the beam.

U.S. Pat. No. 6,646,276 proposes obtaining samples of the beam current passing the substrate holders of a spoked wheel type batch implanter at a sufficiently fast sample rate (1 kHz or higher) so as to achieve multiple current samples of beam ions passing the substrate holders of the scan wheel between adjacent pairs of substrate holders. The patent proposes comparing beam current values obtained between each pair of substrate holders with preceding current values, in order to determine a sudden reduction of beam current, likely to be indicative of a beam glitch. A record is then maintained of the number of beam glitches affecting each substrate of the batch being implanted, in order to provide an indication of substrate wafers in the batch likely to be defective or inadequately implanted. However, the procedure disclosed in this patent provides only an indication of the number of defective fast sweeps of the beam across each substrate, thereby providing only a rough and ready indication of the likelihood of a defective or inadequately implanted substrate.

SUMMARY OF THE INVENTION

It is an object of embodiments of the present invention to enable improved monitoring of the ion beam current during ion implantation, so as to provide a more accurate indication that substrates being implanted have achieved the correct dose and dose uniformity.

Accordingly, the invention provides a method of determining dose uniformity of a scanning ion implanter which performs at least one relative scan between an ion beam and a substrate to be implanted, the method comprising the steps of measuring base beam current at at least one of before and after said scan so as to be unaffected by outgassing from a substrate being implanted, calculating from the measured base beam current a base dose distribution map over the substrate for the scan, detecting beam instability events and measuring the magnitude and position in the scan, over the substrate, of said detected beam instability events, determining from said measured magnitude and scan position corresponding deviations in the calculated base dose map, and subtracting said deviations from the base dose distribution map to provide a corrected dose distribution map.

The invention can be applicable to any scanning ion implanter in which there is relative scanning between the ion beam and a substrate, so that base beam current can be accurately measured, without being substantially effected by increased residual gas pressure from outgassing, at least before or after the or each scan making up the implant. This implies that the scanning process should have a relatively low repetition rate, so that sufficient time can be available before and/or after each scan to allow the residual gas pressure to be pumped back down to nominal and an accurate beam current measurement to be taken. Most commonly, therefore, each said scan will comprise a mechanical reciprocation of the substrate holder through the beam. In the case of a batch type implanter with a scan wheel, each scan comprises a complete reciprocation of the scan wheel axis between positions when the beam is outside the substrates spinning on the outer periphery of the wheel. However, the invention may also be applicable to other types of implanter, including hybrid scanning systems in which a wafer support is reciprocated through the plane of a scanned beam, and also ribbon beam systems in which the wafer support is reciprocated through the plane of a beam having a ribbon like cross-section. The invention may also be useful for two-dimensional mechanical scanning implanters in which a single wafer support performs a raster like mechanical scan through a fixed ion beam.

With the method of the invention disclosed above, accurate base beam current measurements are taken at least between each scan of the implant process. From these accurate beam current measurements, a map can be calculated of the distribution over the substrate of the base dose, for example by assuming that the beam current remains constant over the scan at an average of the accurate measurements taken before and after the scan, or by assuming that the beam current varies over the scan at a constant rate between the before and after measurements.

In one arrangement, the beam instability events may be detected and said magnitude and position thereof may be measured by taking multiple measurements during the scan, of beam ions passing the substrate. These measurements may be taken for example as the beam passes between adjacent substrate supports of a spoke type scan wheel in a batch implanter. Alternatively, these measurements may be taken at the end of each fast line sweep in an arrangement providing a raster scan of a single substrate.

The multiple measurements are used to determine the size and position in the scan over the substrate of beam instability events, such as glitches, occurring during the scan. In effect, the repeated measurements enable measurements not only of the position on a substrate of a fast beam sweep over the substrate during which a beam glitch occurs, but also to provide a measurement of the drop in beam current delivered during the glitch. From these, there is determined the expected deviation, caused by the glitch, in the previously calculated base dose map, so that the determined deviation can be subtracted from the base dose map to provide a corrected dose distribution map.

In another arrangement, the implanter has a source of ions at a source potential, a mass selector structure at a base potential, and a process chamber containing a substrate holder at a target potential, and beam instability events are detected and said magnitude and position thereof are measured by monitoring the total current returning to the mass selector structure which is required to maintain the substrate holder at the target potential.

The measurement of total return current to the mass selector structure (sometimes referred to as the flight tube) is discussed in detail in U.S. Pat. No. 6,608,316, disclosure of which is hereby incorporate by reference. Other methods and arrangements for detecting and measuring beam current instabilities and glitches may be used and examples are described later herein.

In an embodiment, the position and size of all glitches detected throughout each scan can be subtracted from the base dose map to produce a corrected dose distribution map at the end of each scan. If the implant process comprises multiple scans, the procedure continues producing continuously corrected dose distribution maps to the end of the implant. The resulting corrected dose distribution map can then be used to determine whether the dose uniformity on the or each substrate meets the required specification.

Importantly, the amount of each measured deviation which is subtracted from the dose map represents a small proportion of the total dose. In a typical process performed by a scan wheel type batch implanter, each substrate may receive several hundred fast sweeps (each corresponding to a single rotation of the scan wheel) during a complete implant. Each single fast sweep delivers only a small fraction of the dose to any particular area of the substrate. As a result, any error in the measurement of the size of a beam instability event makes a correspondingly small contribution to the error in the resulting corrected overall dose distribution map. Importantly, it is believed that the multiple measurements used for measuring beam instability events during scanning can be performed without taking into account changes in beam neutralisation caused by increases in the residual gas pressure from outgassed material.

In the above mentioned embodiment, the current of beam ions during said scan is measured by sampling the current at a selected frequency which is preferably not less than 1 kHz. Where the implanter performs a plurality of said scans to complete an implant, the base beam current is measured for each scan and the multiple measurements are taken also during each said scan. Then, a complete corrected dose distribution map for the full implant is derived at the end of the implant from said base beam current measurements and said multiple measurements for said plurality of said scans.

Preferably, an accumulated corrected dose distribution map is derived after each one of the scans, from the base beam current measurements and multiple measurements for said one of the scans and any preceding scans of the implant. Then an operator alert is signalled if the accumulated corrected dose distribution map after said one of the scans forecasts that a desired final dose uniformity for the complete implant will not be achieved. This forecast may be obtained by calculating the forecast dose uniformity for the complete implant from the dose uniformity error indicated in the so far accumulated corrected dose distribution map and the relative amount of dose which has been delivered so far to the substrate.

Preferably, the implant is halted after a scan for which the subsequent accumulated dose distribution map data forecasts that the desired final dose uniformity will not be achieved. In this way, it may be possible to apply corrective action to recover the implant before the process is continued. For example, the ion source and ion beam may be retuned to reduce the number of glitches.

In one embodiment, the method is performed in an ion implanter comprises a rotatable substrate holder in the form of a spoked wheel having a plurality of substrate supports on respective spokes thereof with openings between adjacent said substrate supports, the substrate holder being mounted for rotation about an axis of the wheel and the current of beam ions passing between the substrate supports being sampled at discrete time intervals such that, during a scanning operation, a plurality of samples is taken as beam ions pass between adjacent pairs of substrate supports on the holder.

It may also be desirable to control the implanter to respond to the corrected dose distribution map obtained after successive scans during the implant so as to compensate for dose uniformity errors. For example, in some applications, it may be possible to apply additional fast sweeps across the substrate to increase dose in selected areas determined to have been under-dosed according to the corrected dose distribution map.

The invention also provides an ion implanter comprising an ion beam source for generating in a beam direction a beam of ions to be implanted, a substrate holder for supporting a substrate to be implanted, the implanter being operative to perform at least one relative scan between said beam and a substrate on the substrate holder wherein said scan comprises at least one pass across the substrate to uniformly cover the whole substrate, the entire beam missing any substrate on the substrate holder at at least one of the beginning and the end of said scan, a faraday collector located to receive beam ions missing the substrate holder, a detector connected to the faraday to provide signals representing the current of beam ions received by the faraday collector, a beam instability monitor to detect instability events and to measure the magnitude and position in the scan over the substrate of said beam instability events, and a controller. The controller is arranged to be responsive to signals from the detector at at least one of the beginning and the end of the scan to measure a base beam current value which is unaffected by outgassing from a substrate being implanted. In addition the controller is arranged to calculate the base dose distribution map over the substrate for the scan and to determine deviations corresponding to the detected beam instability events. Finally the controller subtracts these deviations from the base dose distribution map to provide data defining a corrected dose distribution map.

Preferably, the substrate holder is arranged such that the entire beam bypasses the substrate holder when missing any substrate thereon at the beginning or the end of said scan, and the faraday collector is located downstream of said substrate holder to receive beam ions bypassing the substrate holder.

In one embodiment, said substrate holder is such that at least a portion of the beam ions bypass the substrate holder and any substrate thereon at least at regular intervals during the or each said pass and said beam instability monitor is responsive to signals from said detector during the or each said pass to detect beam instability events and to measure said magnitude and position thereof.

Examples of the invention will now be described with reference to the accompany drawings.

DETAILED DESCRIPTION OF THE PREFERRED EMBODIMENTS

Figure 1:
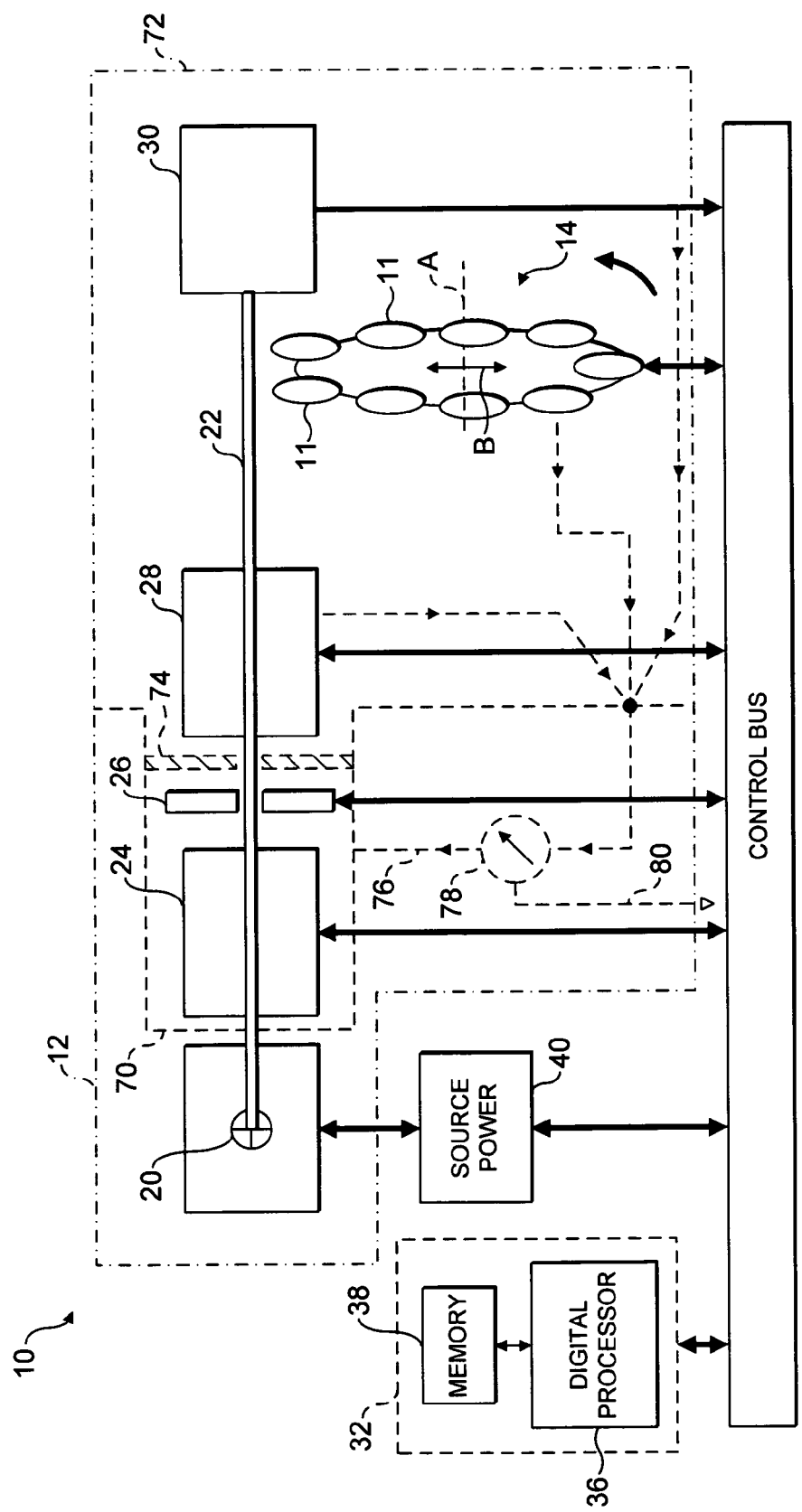
FIG. 1 is a schematic illustration of an ion implanter which may embody and be operated to carry out examples of the present invention.

Referring to FIG. 1, the present invention may be embodied as a batch type ion implanter 10 of the type in which a plurality of substrate wafers 11 are mounted in a vacuum chamber, indicated generally at 12, around the periphery of a spoked type scan wheel 14 (shown only schematically in FIG. 1, but in more detail in FIG. 2). As seen in FIG. 2, the scan wheel 14 comprises a hub 16 having radially extending spokes 18 supporting substrate holders 19 equally spaced about the periphery of the wheel. In operation, the wheel 14 is rotated about an axis A and simultaneously the axis A is reciprocated as indicated by arrows B.

The ion implanter 10 further comprises within the vacuum chamber 12 an ion source 20 generating a beam of ions directed into a magnetic analyser 24. The analyser 24 typically comprises a magnetic sector which causes ions passing through the magnetic field to adopt paths having a curvature dependent on their mass/charge ratio. The ion beam is shown passing through the analyser 24 in a straight line in FIG. 1 for simplicity. Ions of desired mass to charge are then selected from those emerging from the analyser at a mass resolving slit 26, producing a continuing beam 22 of ions of a desired species for implantation.

Ion implanters of this general kind are well known in the art and no further description is considered necessary. The beam 22 emerging from the mass resolving slit 26 may pass through an accelerator/decelerator 28 of known kind to adjust the energy of the mass resolved beam as desired for implantation. In operation, the scan wheel 14 is rotated at a relatively rapid rate whilst at the same time the axis A of the wheel is reciprocated to and fro in the direction of arrows B, so that each of substrates 11 are scanned in two dimensions through the beam 22. The scanning of the substrates is controlled to ensure that each of the substrates on the scan wheel 14 receive the required dose uniformly over all parts of the wafers.

Behind the location of the scan wheel 14, is mounted a faraday collector 30, aligned with the ion beam 22, so as to receive the ion beam when the wheel 14 is holding the substrate 11 completely clear of the beam (as in fact illustrated in FIG. 1). Also, as will become clear from FIGS. 2 and 3, the faraday 30 receives beam ions bypassing the substrates between the respective holders 19 and spokes 18 during the scanning operation.

As illustrated in FIG. 1, the various operating components of the ion implanter are connected to a controller 32 by a control bus 34. The controller 32 incorporates digital processor 36 is connected to memory 38. An ion source power unit 40 delivers the various power supplies to the ion source 20 under the overall supervision and control of the controller 32.

Figure 2A:
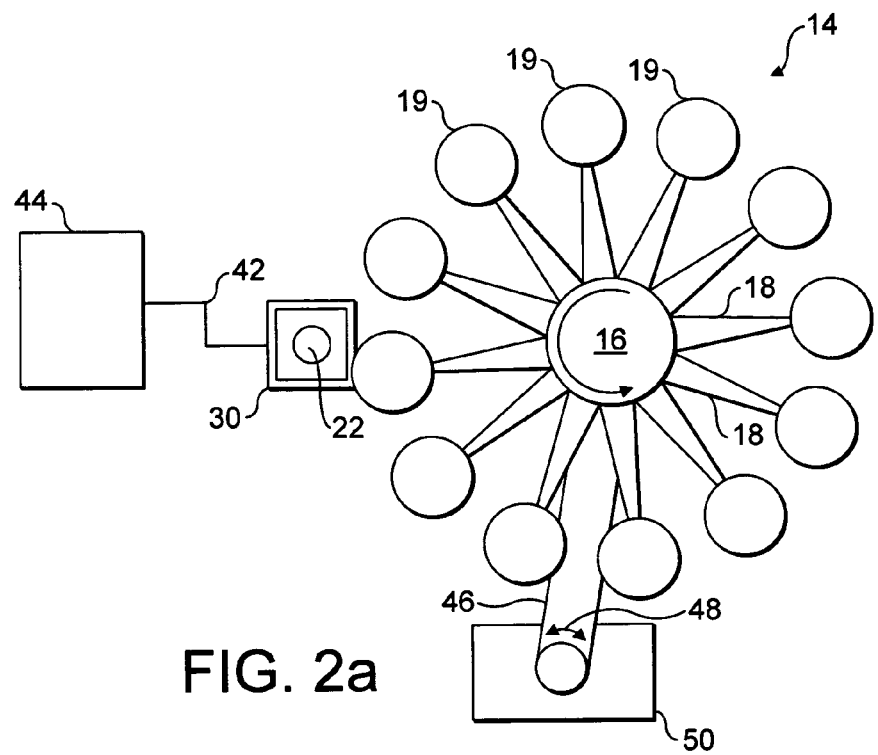
FIGS. 2a and 2b illustrate schematically the spoked scan wheel of the batch type implanter illustrated in FIG. 1, with the scan arm in opposite extreme scan positions.
Figure 2B:
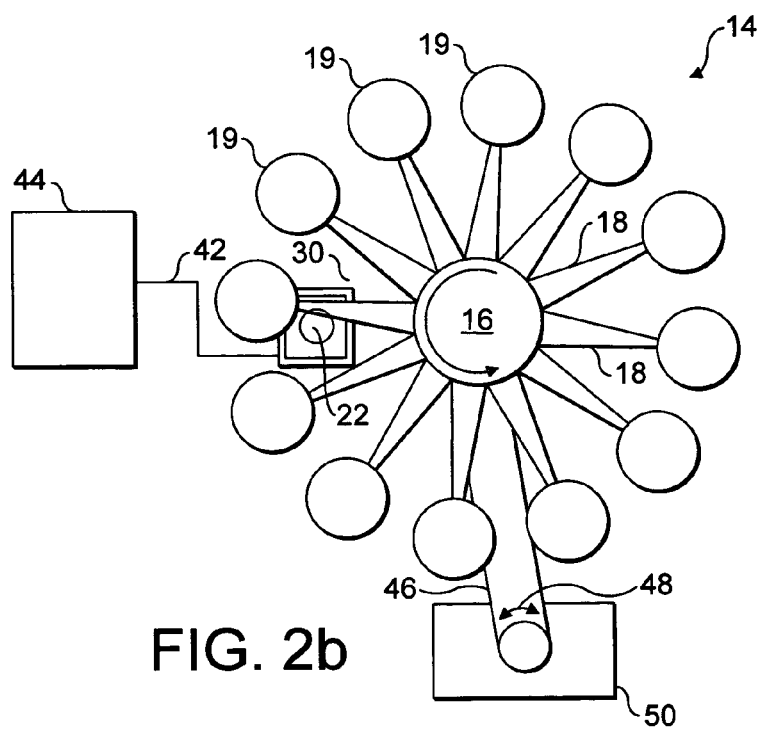

Referring now to FIGS. 2a and 2b, the scan wheel 14 is illustrated viewed along the line of the ion beam 22 which is, therefore, represented in these Figures in an idealised circular cross-sectional form, superimposed on the opening of the faraday collector 30. Beam ions entering the faraday collector 30 produce a corresponding current on line 42 supplied to a sampler and digitiser 44. In the sampler and digitiser 44, samples of current are taken at a relatively high rate, typically above 1 kHz and converted to digital signals which may be communicated to the controller 32 along the control bus 34.

The scan wheel 14 is mounted for rotation at one end of a scan arm 46. The other end of the scan arm 46 is itself mounted for rotation to and fro in the direction of arrow 48 on a scan drive mechanism 50. In operation, the scan wheel 14 is rotated at a relatively high rate, typically 1250 rpm (approximately 20 rotations per second). The scan wheel 14 typically has up to 17 substrate supports 19, although only 12 are illustrated in FIGS. 2a and 2b for simplicity. However, for larger wafer sizes (e.g. 300 mm) only 11 substrate supports 19 may be provided distributed evenly around the periphery of the scan wheel.

During implantation, the wheel is rotated and simultaneously, the scan driver 50 reciprocates the wheel axis to and fro between the extreme positions illustrated in FIGS. 2a and 2b, thereby ensuring that each wafer mounted on a support 19 is scanned through the beam 22 in two dimensional scans comprising a plurality of fast sweeps, corresponding to rotations of the wheel 14, in each slow pass to and fro, corresponding to a reciprocal scan of the scan arm 46.

Each complete reciprocation of the scan arm 46 from the position illustrated in FIG. 2a to the position illustrated in FIG. 2b and then back again to the position of FIG. 2a is considered to be one scan (sometimes called a slow scan), during which all parts of the wafer should be equally exposed to ion beam current to receive at least part of the required overall dose evenly distributed over the surface of each substrate. The rate of reciprocation of the scanning mechanism 50 is much slower than the rotation rate of the scan wheel 14, so that one complete slow scan may take between two and four seconds.

Figure 3B:
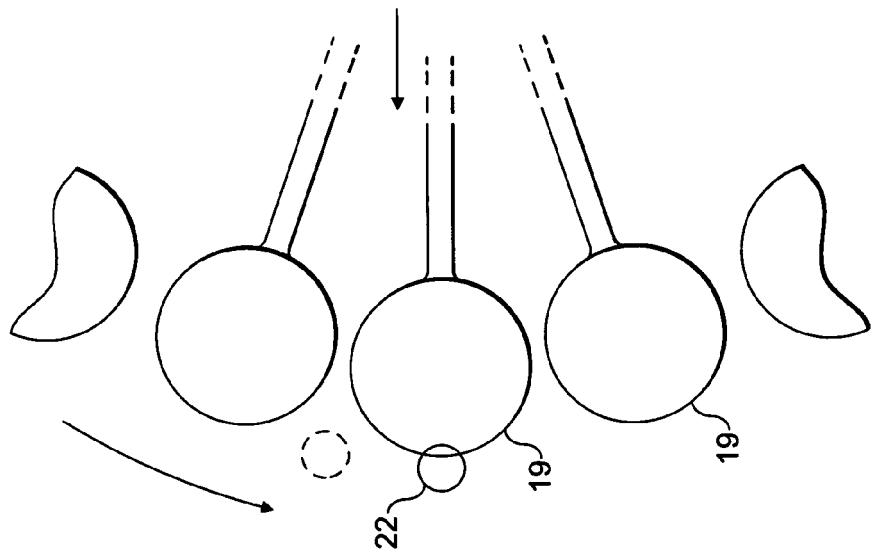
FIGS. 3a to 3e illustrate in greater detail the passage of the scan wheel, with movement of the scan arm, between extreme scan positions.
Figure 3A:
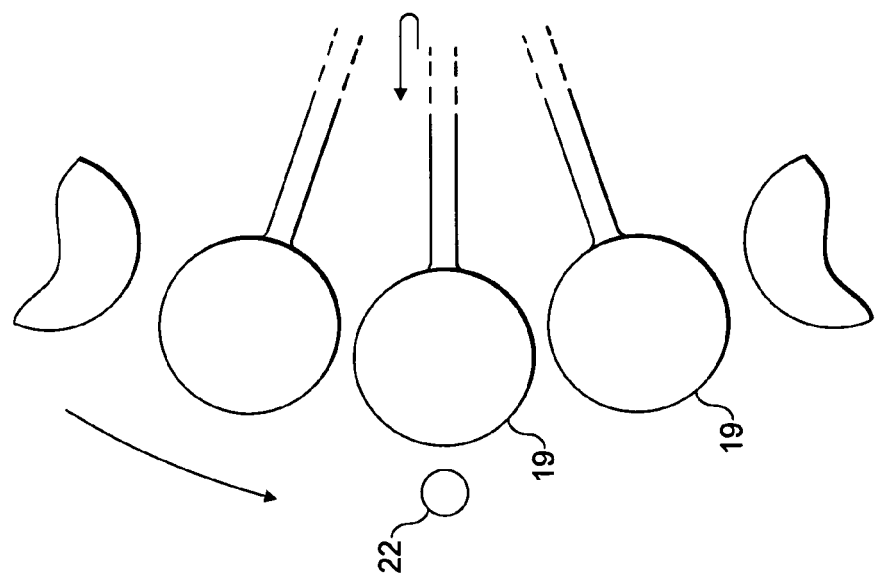
Figure 3E:
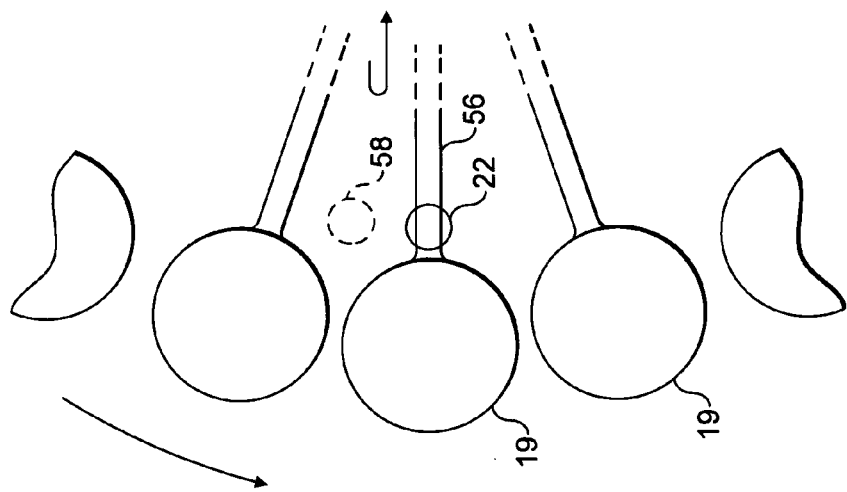
Figure 3D:
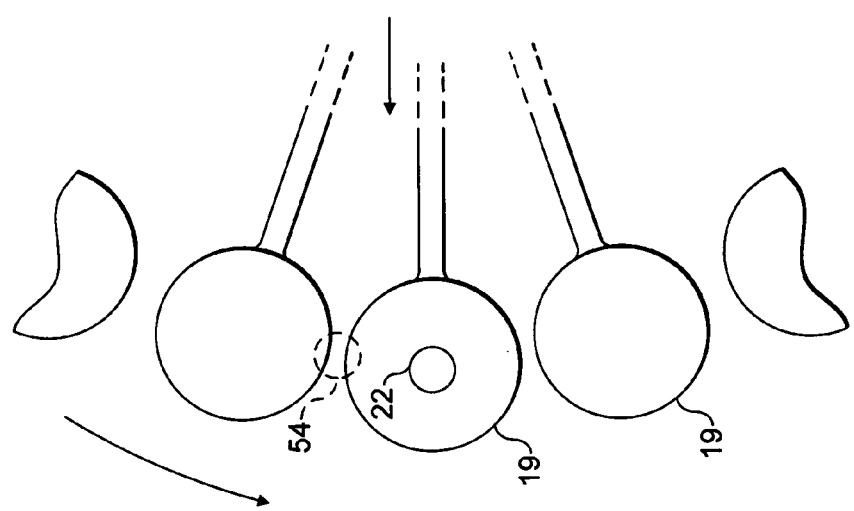
Figure 3C:
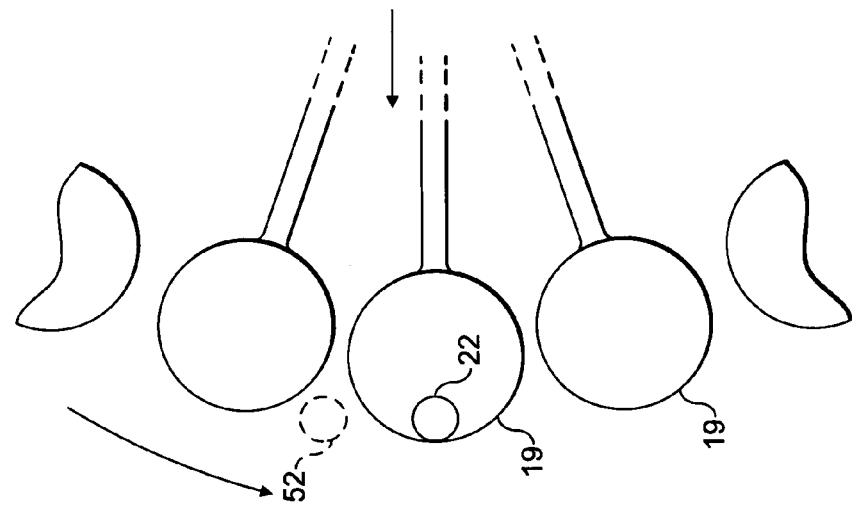

FIGS. 3a to 3e illustrate the positions of the substrate wafers and substrate supports 19 relative to the ion beam 22 at different positions in the slow scan of the scan arm 46. FIG. 3a shows the start position of the scan with the wafer supports 19 spinning with the wheel 14, clear of the ion beam 22, so that the whole ion beam 22 reaches the faraday collector 30 (not shown in FIG. 3). FIG. 3b illustrates a position near the start of the scan when the wafer supports 19 first begin to clip the ion beam 22. FIG. 3c illustrates a position further on in the slow scan when the ion beam 22 is first fully occluded by the substrate supports 19. However, a full ion beam can still pass between neighbouring pairs of substrates 19 as illustrated by the beam cross-section shown in dotted outline at 52. FIG. 3d illustrates the position halfway through the first pass of the scan when the ion beam passes over the centre of each substrate 19 and also crosses the gap between adjacent pairs of substrate supports 19, as illustrated by the beam cross-section shown in dotted outline at 54. However, as can be seen in FIG. 3d, even when the beam is passing between adjacent substrate supports, part of the beam is occluded and does not reach the faraday collector. FIG. 3e illustrates the full extent of the scan before the return pass, at which the beam is fully clear of the inner edge of the substrate supports 19, but it is at least partially occluded by the spoke arms 56. However the full beam current reaches the faraday collector when the beam is between the spokes as illustrated by the beam cross-section shown dotted at 58.

Figure 4:
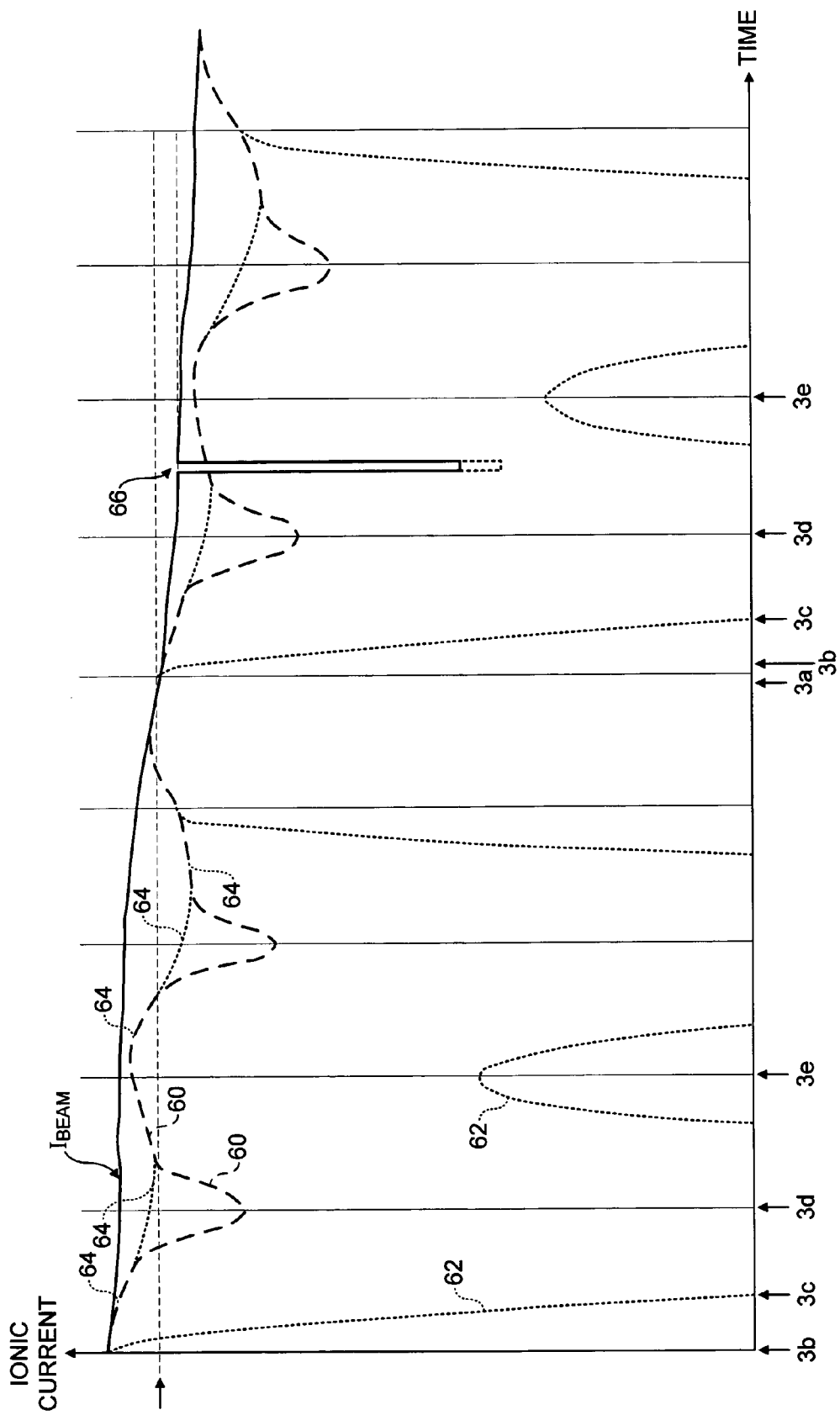
FIG. 4 is a graphical representation of the actual beam current ($I_{Beam}$) and the variation in the current of beam ions as measured by the collecting faraday over the range of positions of the scan wheel of the implanter of FIGS. 1 to 3.
Figure 5:
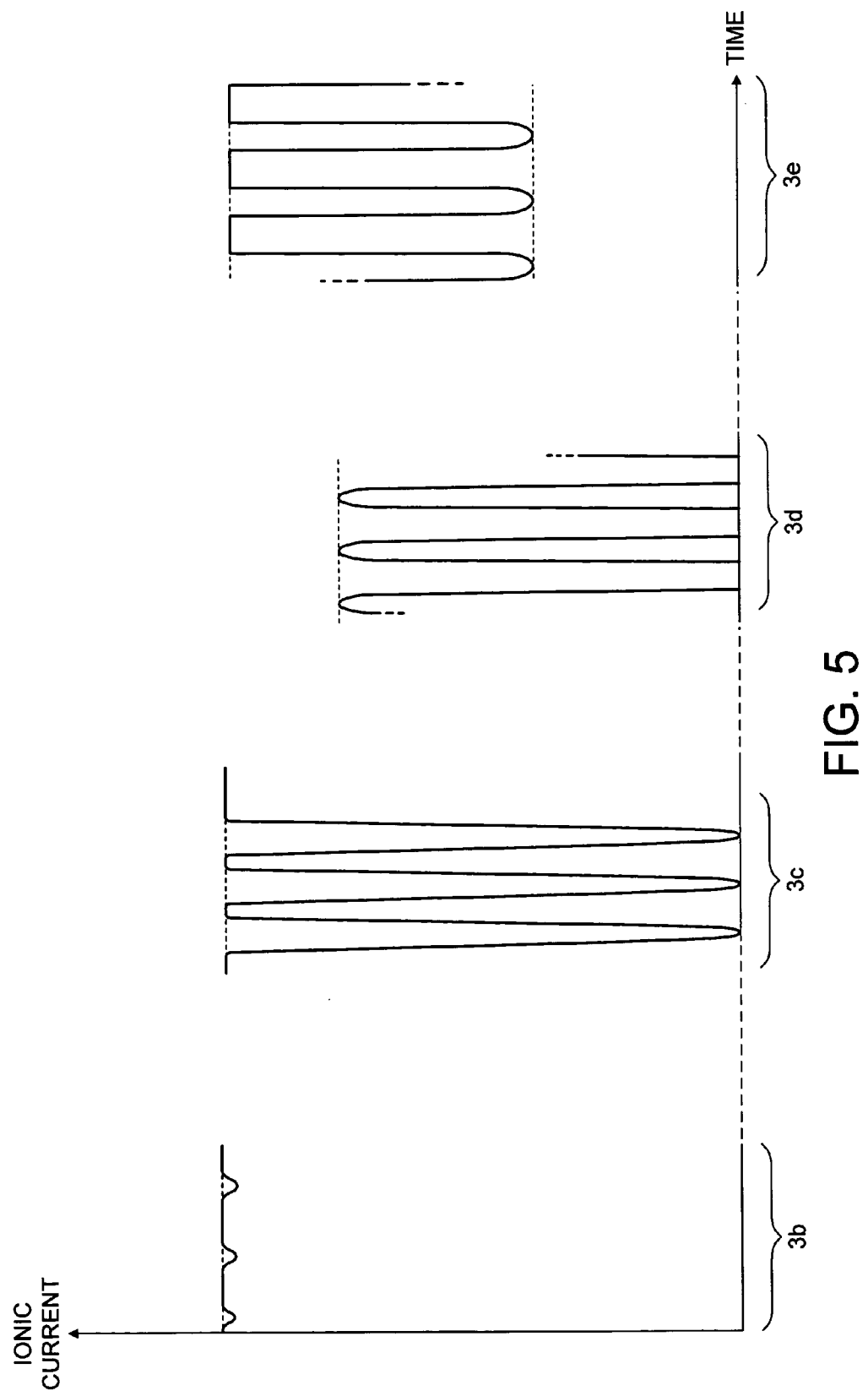
FIG. 5 is a graphical representation showing portions of the measured current of FIG. 4 greatly expanded in the time axis.

FIGS. 4 and 5 illustrate the current of beam ions received by the faraday collector 30 over the range of scan positions of the scan wheel 14 during an implant procedure. Referring firstly to FIG. 5, fluctuations in measured ion current detected by the faraday 30 are illustrated at three different scan positions, corresponding to positions illustrated in FIGS. 3b, 3c, 3d and 3e respectively. The left hand section (marked 3b) of FIG. 5 shows the full measured beam current with small and progressively increasing dips caused as each of the substrate holders 19 of the scan wheel clips the ion beam in the first stages of the scan. In the portion of FIG. 5 marked 3c, the measured ionic current reaching the faraday is shown reaching zero each time a substrate holder 19 of the scan wheel just fully occludes the beam 22, as illustrated in FIG. 3c. In FIG. 5, the measured ionic current is zero for an extended period of time as each substrate holder 19 passes through the beam, and the detected ion current bypassing the substrate holders 19 rises to a lower maximum level which is less than the full beam current. The maximum level received during this part of the scan is, as illustrated in FIG. 3d, dependent on the height of the cross-section of the beam 54 in relation to the spacing between adjacent pairs of substrate holders 19. During the period of the scan marked 3e in FIG. 5, the measured ionic current is at a maximum level, representing the full ionic beam current for an extended period of time reducing to the minimum level which is above zero when the height of the beam cross-section is greater than the width of the spoke 56 of the scan wheel 14, as illustrated in FIG. 3e.

It will be appreciated that the repetition rate of the pulses of detected ionic current illustrated in FIG. 5 would be about 350 Hz, for a scan wheel with 17 wafer supports 19 rotating at 1250 rpm (230 Hz for a scan wheel for 300 mm wafers with 11 wafer supports). Thus, a single pass of the scan wheel from the position of FIG. 3a to the position of FIG. 3e taking between one and two seconds, would contain 350–700 current pulses (230–460 for a 300 mm implanter).

FIG. 4 illustrates the envelope of the ionic current pulses of FIG. 5 over two full scans of the scan wheel 14. The current pulses are formed between an upper dotted line 60 and a lower dotted line 62. In FIG. 4, the true ion beam current $I_{Beam}$ is shown by the solid line. Ideally, this actual beam current is entirely constant throughout an implant. However, in practice the beam current $I_{Beam}$ can experience a slow drift in value, typically caused by progressive changes such as erosion in the ion source. This slow change in true beam current is shown in FIG. 4 considerably exaggerated.

FIG. 4 illustrates also a phenomenon caused by outgassing from the substrate wafers being implanted, which causes increased neutralisation of beam ions, so that the current of ions received by the faraday collector in fact under records the true flux of the desired particle species in the beam. As is understood by those skilled in this field, the beam of particles reaching the substrate to be implanted always includes some particles which have been neutralised and so cannot be measured by the faraday collector (when the substrate is withdrawn from the beam). However, when the residual gas pressure in the process chamber of the implanter remains at the required nominal pressure, a simple empirically determined scalar correction can be applied to the measured ionic current at the faraday collector, to obtain a value for the true flux of desired implant species in the beam. In operation of the implanter, the controller 32 is programmed to apply this scalar correction in dependence on the species being implanted. However, as explained previously, during implantation, outgassing causes the residual gas pressure to increase, so that the number of ions in the beam being neutralised also increases. As a result, the current measured by the faraday collector, even when corrected with the scalar correction factor, begins to under measure the true flux of desired implant species. This under measuring of the implant species caused by outgassing from the substrate wafers during implantation, is represented in FIG. 4 by the dashed line 64. The amount of under measuring of beam current increases as the scan progresses and the ion beam spends a higher proportion of time on the substrate wafers being implanted. This is due to the increasing residual gas pressure caused by the increasing outgassing. When the scan reaches the furthest extreme (as illustrated in FIG. 3e) residual gas pressure tends to drop again, with continued vacuum pumping of the system, so that under measuring of beam current can fall before increasing again as the scan returns back through the wafer. At the end of the scan, sufficient time is provided with the beam completely clear of substrate wafers on the scan wheel for the residual gas pressure to be pumped back down to the nominal value, so that by the beginning of the next scan, a measured beam current should again represent true beam current (after scalar correction in the controller 32).

The amount of under measurement caused by outgassing is generally exaggerated in FIG. 4. Nevertheless, the phenomenon of under measuring beam current due to varying outgassing during implanting can, if not corrected for, cause errors in beam current measurement, and consequently errors in the monitoring of the overall dose delivered to the substrates being implanted.

FIG. 4 further illustrates at 66 a glitch or instability in the beam current. Such a glitch or instability is typically caused by an arcing event associated with the ion source or the extraction and acceleration/deceleration electrodes of the beam line. Accordingly, these instabilities have very fast onset, typically 1 millisecond or less, are of relatively short duration, 50–500 milliseconds, and sharp recovery, typically 1 millisecond. The example of glitch 66 illustrated in FIG. 4 has a duration of approximately 100 milliseconds and causes a temporary reduction in beam current $I_{Beam}$ to about 50% of its previous value.

The operation of the described ion implanter in accordance with examples of the present invention will now be described further. During the implantation process, the ionic current received by the faraday collector 30 is sampled and digitised by digitiser 44 at a rate in excess of 1 kHz, typically 5 kHz. In the case of a scan wheel for 300 mm wafers having 11 wafer supports, the rate at which successive wafer supports pass the ion beam, when the scan wheel is rotating at 1250 rpm, is about 230 Hz. The rate of sampling ionic current received by the faraday collector 30 should be substantially higher than this to ensure that adequate samples are taken between each adjacent wafer support.

Conveniently, the actual rate of sampling may be synchronised to the wheel rotation, so that samples are taken at predictable positions of each substrate holder relative to the ion beam.

The digitised ionic current readings are supplied to the controller 32 wherein digital processor 36 is arranged to store the received sample values in memory 38. At the same time the digital processor analyses the samples as they are received to identify values of ionic current at the moments when the ion beam is halfway between adjacent pairs of wafers.

At the beginning of each scan, before the scan arm 46 brings wafer supports 19 to a position where they begin to intercept the ion beam 22, a value is determined of the beam current from recent ionic current samples. At this point, the ionic current samples should be free of the effect of outgassing, provided sufficient time has elapsed since the end of the previous scan to allow the evacuation system of the process chamber to return the residual gas pressure to the nominal value. Accordingly, an accurate value of true beam current can be obtained by applying the predetermined scalar factor to ionic current measurements taken before the beginning of each scan.

During the course of each pass to and fro of the subsequent scan of the scan wheel, current samples continue to be taken and recorded by the digital processor 36 in memory 38. The current values recorded during the scan of the scan wheel are analysed by the digital processor 36 to identify a glitch or instability, such as 66 in FIG. 4, and when identified to measure the size of the glitch and its position in the scan.

The presence of a glitch is identified by comparing the ionic current measurements at the midpoints between successive pairs of wafer supports during the scan. These ionic current measurement values tend to follow curve 60 in FIG. 5 and are smoothly changing, with a variation between successive substrate supports of less than 1%. The fast onset of a glitch or instability, on the other hand, can produce a change in ionic current value at the midpoints between successive pairs of substrate holders typically in excess of 10%, and often 50% or more. The size of variation indicative of a glitch can vary greatly depending on the specific implementation.

The digital processor 36 is programmed to review ionic current values for successive midpoints between substrate holders to identify a sudden change in value indicative of the start of a glitch or instability.

The digital processor 36 with memory 38 is also arranged to monitor the precise position of the scan process at any time, i.e. the precise rotary position of the scan wheel 14 and also the precise position of the scan arm 46. With this information, digital processor 36 identifies the precise position in the scan of the beginning of the detected glitch or instability, i.e. the radial position of the stripe made by the ion beam across the substrate wafers at the point of onset of the glitch, and also the first wafer in the batch effected by the glitch (taken to be the wafer which has just passed through the beam when the glitch is first detected).

Further, on detecting the start of a glitch, ionic current values during the course of the glitch are measured and recorded in memory 38.

The recovery of the glitch or instability is also detected, again by monitoring values of ionic current at midpoints between successive substrate holders, to identify when this ionic current returns to a value close to the value immediately before the glitch was detected. Again, the position of the recovery of the glitch is recorded in the memory 38 in terms of the last scan wheel rotation and substrate holder effected by the recorded glitch.

If the detected glitch occurs only during a part of the scan when the full beam flux passes between adjacent substrate holders for reception by the faraday collector, for example as illustrated at 66 in FIG. 4, the ionic current values measured by the faraday collector are effected only by beam neutralisation caused by outgassing. Although the amount of outgassing during scanning is unpredictably variable, for reasons that will become apparent later herein, adequate accuracy for the measurements of drop in ionic current during a beam glitch can be obtained by applying a scalar factor to the measured value. This scalar factor may be different from the scalar factor mentioned previously which is applied to the current measurements taken before the start of each scan. The scalar factor applied to the glitch measurement can be determined empirically for each species to be implanted.

At the midpoint of each pass of a scan, illustrated for example in FIG. 3d, the measured value of the glitch or drop in ionic current is also effected by the geometry of the beam cross-section and the gap between adjacent pairs of wafer supports 19. An additional geometric correction factor can therefore be applied to the measured glitch size values if the glitch extends into these regions of the scan. Such a geometric correction can be determined from the known geometry of the wafer supports and the profile of the ion beam cross-section, which may in turn be measured by a known technique prior to the start of the implant. Alternatively, correction for the size of a beam glitch extending into the mid scan region can be derived by comparing the measured ionic current immediately before detection of the glitch, with measured ionic current earlier in the scan at a position when the full beam current is received by the faraday collector at the midpoint between adjacent wafer supports. The comparison may be used to derive a correction factor which can be multiplied with the measured glitch size to derive a corrected value. The correction factor may be the ratio of the earlier measured current value for the full beam current to the current value immediately before the glitch.

The digital processor continues to monitor for glitches, recording their size and position in the scan, until completion of the inwards and then outwards passes of the scan. At the end of the scan, sufficient time is allowed for residual gas pressure to drop back to the nominal value so that a fresh measurement can be made of actual beam current $I_{Beam}$ as described previously, before the start of the next scan.

At this time, the digital processor may simply continue to record the $I_{Beam}$ readings taken between each successive scan of the implant, and also the values and positions of any detected glitches until the whole implant is completed.

In accordance with the normal procedure, the scanning speed, particularly of the scan arm 46, may be adjusted over the successive scans of the implant to compensate for any slow fluctuations in $I_{Beam}$, to ensure that the total implant delivers the desired dose to the wafers on the substrate holders.

In addition, the digital processor 36 is arranged at the end of the implant to generate data defining a base dose distribution map over the wafers mounted on the scan wheel, using for this purpose the $I_{Beam}$ values measured at the beginning of each scan of the implant. As discussed previously, these $I_{Beam}$ values are considered to be accurate and not susceptible to the effects of outgassing. The resulting base dose distribution map should show the desired dose delivered to all parts of the wafer with a dose uniformity as predicted by the scanning geometry and beam profile. However, at this stage, the base dose map takes no account of any short term instabilities and glitches in the ion beam which may have occurred during the implant.

The base dose map is then corrected by subtracting therefrom the glitches and instabilities recorded in memory 38. This produces a corrected dose uniformity map for the substrates on the scan wheel. For example, the corrected dose map of a wafer on the scan wheel which has been subject to a single glitch or beam instability would show a stripe across the dose map of the wafer of slightly reduced dose.

In order to calculate the corrected dose map of the wafers, assumptions have to be made about the profile of the ion beam cross-section in the direction of slow scanning, i.e. transverse to the stripe direction on the wafer. As mentioned previously, it is common practice to measure the beam cross-section or profile prior to implanting and this measured profile may be used so as to present an accurate profile of the stripe of reduced dose across a wafer produced by a detected glitch during the implant. However, simplified beam profiles may also be used for correcting the dose map. For example, useful results can be obtained assuming the beam profile is square having a width corresponding to the half current points of the actual beam profile.

Importantly, the resulting corrected dose map for the implant can have a high degree of accuracy, even though the measurements used to determine the size of the beam glitches are taken with only a simple scalar correction to account for variations in beam neutralisation caused by outgassing. This is because of the subtractive process used for calculating the corrected dose uniformity map. As explained previously, the base dose uniformity map is not substantially dependent on outgassing effects. In a typical implant, each point on the wafer being implanted may receive a contribution to the final dose of the implant from 20 individual stripes of the beam across the wafer each reciprocating scan. For a full implant each point on the wafer may "see" the beam a hundred times or more. If a point on the wafer is effected by a single beam glitch during an implant, this corresponds to a reduced value of a single stripe over the wafer, the stripe contributing possibly to no more than 1% of the total dose delivered at that point. Accordingly, any error in the measurement of the beam glitch used to calculate the corrected dose map would contribute such an error to only 1% of the total dose. For example, an error of 5% in measuring the size of the glitch would produce an error in the corrected dose map of only 0.05%.

With the system operating as described above, a corrected dose map is provided, for each substrate in a batch, at the end of the implant, so that the resulting dose uniformity on each substrate (more strictly a value for dose non-uniformity) can be determined. This information can be recorded automatically for each of the individual substrates of the batch and used subsequently for further processing or analysis of the substrates.

Instead of processing the ionic current information recorded in memory 38 at the end of the implant to derive a base dose map and a corrected dose map as described above, processing may be performed during an implant and then used to control the continuation of the implant.

For example, a partial base dose map can be produced at the end of each scan of the implant and the values and positions of glitches detected during that scan can then be subtracted from the base dose map to produce a partial corrected dose map.

The digital processor 36 may then be used to perform a further analysis of the partial corrected dose map to determine whether the implant should proceed. A dose non-uniformity value can be obtained from the partial corrected dose map at the end of a scan and used to project the final dose non-uniformity at the end of the implant. This final dose non-uniformity may be projected or forecast by comparing the dose non-uniformity obtained with the dose delivered by the scans performed so far, to obtain a value for non-uniformity as a percentage of the partial dose delivered to the substrate at that stage of the implant. If the dose non-uniformity percentage at that stage of the implant exceeds the desired non-uniformity percentage for the completed implant, then the implant is halted and an operator alert is signalled. This procedure permits the operator to take corrective action with a view to reducing the number and size of glitches and instability events in the ion beam, so that the implant can then be continued to completion with an overall dose non-uniformity percentage within desired limits.

It is further contemplated that the digital processor 36 may be programmed to respond to a corrected partial dose map obtained after a scan of a total implant, to modify the continuing implant to correct the dosing errors in the accumulated dose map so far. For example, the ion beam may be selectively turned on and off during a scan to "repaint" missing stripes over selected wafers on the scan wheel at positions corresponding to previously detected instability events.

Instead of using a partial corrected dose map to control the subsequent implants to "correct" dose deviations caused by previous glitches, a corrective implant may be performed after the original implant is completed. Then, the full corrected dose map after completion of the implant is used by digital processor 36 to control a subsequent correcting implant during which the ion beam is turned on and off to apply "touch up" stripes to the wafers as indicated, thereby reducing overall dose non-uniformity.

The example of the invention described above is performed using a batch implanter having a scan wheel in the form of wafer supports on individual spokes, so that beam ions can pass the wafer supports to reach the faraday, through the gaps between adjacent pairs of supports. A characteristic of the described examples of the invention is that an implant comprises one or more relative scans between the ion beam and wafer support, wherein a beam current reading may be taken before and/or after each scan which is substantially unaffected by outgassing, to determine accurate beam current values. During each scan, the scanning system enables the current of beam ions bypassing the substrate holders to be measured at sufficiently regular intervals to enable beam glitches to be detected and the size and position in the scan of the glitches to be determined and recorded. The measured beam glitches are subtracted from the base dose map inferred from the accurate beam current readings obtained before and/or after each scan.

The principles of the invention may also be applied to other kinds of implanter. For example, a single wafer implanter may mechanically scan a single wafer in a raster style pattern through a fixed ion beam. An ion implanter of this kind is disclosed in WO 03/088303. Accurate beam current measurements can be determined at the beginning and/or end of each raster scan, and further current measurements taken at the end of some or all of the individual raster lines to provide sufficient readings to identify beam glitches. A corrected dose map can then be obtained with higher accuracy without the need to compensate the current readings taken during the raster scan for the effects of outgassing. Although both of the examples described so far contemplate two-dimensional mechanical scanning of the wafer through a fixed ion beam, examples of the invention may also be used with a hybrid scanning type implanter in which each scan comprises a pair of reciprocal passes of a wafer holder through the plane of a scanned beam. Then, the wafer holder should be held clear of the scanned beam at the beginning and/or end of each pass through the beam for long enough for the residual gas pressure to be pumped back down to nominal, so that an accurate ion beam current can be measured. Values of ion current can then be determined during each pass of the substrate through the scanned beam, by monitoring ionic current as the beam momentarily at least partially bypasses the substrate holder at at least one end of each line scan of the beam. These measurements can be used to produce base dose uniformity maps and corrected dose uniformity maps as described previously.

Instead of passing a substrate holder through a scanned beam, the same effect can be obtained when mechanically passing the wafer holder through a ribbon beam. In the case of a ribbon beam a fixed beam is produced having a cross-section in one dimension sufficient to extend over the entire face of the wafer to be implanted. So long as part of the beam bypasses the wafer as the substrate holder is passed mechanically through the plane of the ribbon beam, ion current readings can be obtained during each scan. Assuming the ribbon beam has uniform current density along the length of the cross-section of the ribbon beam, readings of ion current bypassing the wafer holder during scanning can be used to detect and measure the size of beam glitches to sufficient accuracy to be used to correct a base dose uniformity map as described above.

In the above preferred embodiment, beam instability events or glitches are detected and the magnitude and position in the scan thereof is measured by monitoring regular periodic measurements of current at a beam stop receiving beam ions bypassing the substrate holders during a scan. As explained such an arrangement is particularly but not exclusively applicable to a batch implanter with a spoked scan wheel providing spaces between adjacent substrate holders around the periphery of the wheel.

In another embodiment the substrate holder itself, and any substrate or substrates thereon, may form the collector of a faraday, so that beam current measurements may be taken continuously during scanning. Then the faraday may be used to take base beam current values at the beginning and/or the end of each scan, when the entire beam misses any substrate on the holder. The beam current during each scan is monitored to identify and measure the magnitude of glitches for use in modifying the base dose distribution map.

Other arrangements and methods can be employed for detecting and measuring glitches. For example, glitches can be measured by monitoring the total current returning to the mass selection structure of the implanter. Referring to FIG. 1, the mass selection structure of the illustrated implanter is shown schematically by the dotted box 70. This mass selection structure 70, sometimes referred to as the flight tube of the implanter, is commonly held at a base potential, normally ground potential. The ion source 20 is maintained at a source potential which will, for positive ions, be a positive potential relative to the base potential of the mass selection structure 70. Substrates on the substrate holders 11 of the scan wheel are maintained at a target potential, which may differ from the base potential of the mass selection structure 70 if DC acceleration or deceleration is provided to the ion beam after mass selection, e.g. by accelerator/decelerator 28. Nearly all significant beam instabilities and glitches occur due to events in the ion source, or at the electrode structures which form the beam leaving the ion source prior to entry into the mass selection structure 70.

As fully explained in the aforementioned U.S. Pat. No. 6,608,316, the beam of ions leaving the mass selection structure 70 and directed towards substrates on the substrate holders 11, or the faraday beam stop 30 in the process chamber of the implanter, represents a flow of positive charge (for a beam of positive ions) flowing from the mass selection structure 70 into the process chamber. In order to maintain the target potential of the substrate holders at a desired value relative to the base potential of the mass selection structure 70, an equivalent positive current must flow back to the mass selection structure 70. If the process chamber 72 is connected to the mass selection structure 70 by an electrically insulating vacuum coupling e.g. as shown schematically at 74, then the current returning to the mass selection structure 70 can be collected to flow along a single conductor 76.

In FIG. 1, the acceleration/deceleration unit 28 is shown as part of the process chamber 72. In fact the acceleration/deceleration unit 28 may alternatively be connected to be part of the mass selection structure 70. In which case, the power supplies used for the acceleration/deceleration unit 28 are referenced to the mass selection structure 70, rather than to the process chamber 72.

The total return current flowing in conductor 76 back to the mass selection structure 70 must have an appropriate value in order to maintain the substrate supports 11 at the desired target potential relative to the mass selection structure 70. This current value is related to the beam current leaving the mass selection structure. A current meter 78 provides a current signal on a line 80 for supply to the control bus 34. In this embodiment, controller 32 employs the current reading supplied on line 80 to monitor beam current for instability events and glitches. The timing of the detected events relative to the known scan position of the scan wheel 14 provides an indication of the position of the respective glitch in the scan over the substrates.

With this arrangement, it is possible to identify and measure instability events and glitches without obtaining measurements of the current of beam ions bypassing wafers between adjacent wafer holders and the spoked scan wheel. In addition, it can be understood that this arrangement for monitoring the ion beam for instability events can be used with solid type scan wheels for which no substantial beam current can reach the faraday 30 during scan while the ion beam 22 is intercepted by the wheel.

In another embodiment, the beam may be monitored to detect and measure instability events and glitches using a beam line beam current monitor, such as an inductive device, which directly measures beam current. Such an inductive beam current measuring device may be located at any convenient position along the beam line, downstream of locations where instability events are likely to be caused.

Beam instability events and glitches may also be detected and measured by monitoring a parameter of the ion source 20. It is well understood in the field of ion implanters that beam instabilities and glitches are usually associated with a fault event in the ion source, which may be detected as an unusual excursion of an ion source parameter, such as a voltage or a current of one of the supplies to the ion source or to the electrodes used to extract ions from the source and form the ion beam delivered to the mass selection structure 70. In particular, the drain current of the primary acceleration electrode used for extracting ions from the ion source can be monitored to detect exceptional excursions indicative for example of an arcing or "latch up" event.

What is claimed is:

1. A method of determining dose uniformity of a scanning ion implanter which performs at least one relative scan between an ion beam and a substrate to be implanted, the method comprising the steps of measuring base beam current at at least one of before and after said scan so as to be unaffected by outgassing from a substrate being implanted, calculating from the measured base beam current a base dose distribution map over the substrate for the scan, detecting beam instability events and measuring the magnitude and position in the scan, over the substrate, of said detected beam instability events, determining from said measured magnitude and scan position corresponding deviations in the calculated base dose map, and subtracting said deviations from the base dose distribution map to provide a corrected dose distribution map.

2. A method as claimed in claim 1, wherein beam instability events are detected and said magnitude and position thereof are measured by taking multiple measurements during said scan of a current of beam ions bypassing the substrate.

3. A method as claimed in claim 2, wherein the current of beam ions during said scan is measured by sampling the current at a selected frequency.

4. A method as claimed in claim 3, wherein said selected frequency is not less than 1 kHz.

5. A method as claimed in claim 1, wherein the implanter performs a plurality of said scans to complete an implant, said base beam current being measured for each said scan, and said beam instability events being detected, said magnitude and position thereof being measured and said dose map deviations being determined during each said scan.

6. A method as claimed in claim 5, wherein a complete corrected dose distribution map for the full implant is derived at the end of the implant from said base beam current measurements and said dose map deviations for said plurality of said scans.

7. A method as claimed in claim 5, wherein an accumulated corrected dose distribution map is derived after each one of said scans, from said base beam current measurements and said dose map deviations for said one of said scans and all preceding said scans of the implant, and an operator alert is signalled if the accumulated corrected dose distribution map after said one of said scans forecasts that a desired final dose uniformity for the complete implant will not be achieved.

8. A method as claimed in claim 7, wherein the implant is halted after a scan for which the subsequent accumulated dose distribution map data forecasts that the desired final dose uniformity will not be achieved.

9. A method as claimed in claim 7, wherein a forecast dose uniformity for the complete implant is calculated from the dose uniformity error indicated in the accumulated corrected dose distribution map after the latest of said scans, relative to the dose so far delivered to the substrate.

10. A method as claimed in claim 2 when carried out in an ion implanter comprising a rotatable substrate holder in the form of a spoked wheel having a plurality of substrate supports on respective spokes thereof with openings between adjacent said substrate supports, the substrate holder being mounted for rotation about an axis of the wheel and the current of beam ions passing between substrate supports being sampled at discrete time intervals such that during a scanning operation, a plurality of samples is taken as beam ions pass between adjacent pairs of substrate supports on the holder.

11. A method as claimed in claim 1, wherein said at least one relative scan is a two-dimensional relative scan.

12. A method as claimed in claim 1, wherein the implanter comprises a source of ions at a source potential, a mass selector structure at a base potential, and a process chamber containing a substrate holder at a target potential, and beam instability events are detected and said magnitude and position thereof are measured by monitoring the total current returning to the mass selector structure which is required to maintain the substrate holder at the target potential.

13. A method of implanting ions into a substrate in a vacuum chamber of a scanning ion implanter which performs at least one relative scan between an ion beam and the substrate to be implanted, the method comprising the steps of measuring base beam current at at least one of before and after said scan so as to be unaffected by outgassing from a substrate being implanted, calculating from the measured base beam current a base dose distribution map over the substrate for the scan, detecting beam instability events and measuring the magnitude and position in the scan, during scanning of the substrate, of said detected beam instability events, determining from said measured magnitude and scan position corresponding deviations in the calculated base dose map, subtracting said deviations from the base dose distribution map to provide a corrected electronically recorded dose distribution map, and subsequently operating the implanter in response to the corrected map to compensate for dose uniformity errors.

14. An ion implanter comprising an ion beam source for generating in a beam direction a beam of ions to be implanted, a substrate holder for supporting a substrate to be implanted, the implanter being operative to perform at least one relative scan between said beam and a substrate on the substrate holder wherein said scan comprises at least one pass across the substrate to uniformly cover the whole substrate, the entire beam missing any substrate on the substrate holder at at least one of the beginning and the end of said scan, a faraday collector located to receive beam ions missing the substrate holder and any substrate thereon, a detector connected to the faraday to provide signals representing the current of beam ions received by the faraday collector, a beam instability monitor to detect beam instability events and to measure the magnitude and position in the scan over the substrate of said beam instability events, and a controller which a) is responsive to signals from the detector at at least one of the beginning and the end of the scan to measure a base beam current value which is unaffected by outgassing from a substrate being implanted, b) is arranged to calculate, from the measured base beam current value, data defining a base dose distribution map over the substrate for the scan, c) is further arranged to determine deviations in the base dose distribution map corresponding to the detected beam instability events, and d) is further arranged to subtract said deviations from the base dose distribution map to provide data defining a corrected dose distribution map.

15. An ion implanter as claimed in claim 14, wherein the substrate holder is arranged such that the entire beam bypasses the substrate holder when missing any substrate thereon at the beginning or the end of said scan, and the faraday collector is located downstream of said substrate holder to receive beam ions bypassing the substrate holder.

16. An ion implanter as claimed in claim 15, wherein said substrate holder is such that at least a portion of the beam ions bypass the substrate holder and any substrate thereon at least at regular intervals during the or each said pass and said beam instability monitor is responsive to signals from said detector during the or each said pass to detect beam instability events and to measure said magnitude and position thereof.

17. An ion implanter as claimed in claim 16, wherein the controller comprises a digital processor arranged to sample the signals from the detector at a pre-selected frequency, and a memory for storing the sampled signals.

18. An ion implanter as claimed in claim 17, wherein said processor is arranged to process the sampled signals to produce and store in said memory electronic signals representing said corrected dose distribution map.

19. An ion implanter as claimed in claim 14, wherein the controller is arranged to operate the implanter, in response to said corrected dose distribution map, to implant ions into the substrate so as to compensate for dose uniformity errors.

20. An ion implanter as claimed in claim 16 operative such that said relative scan is a two-dimensional raster scan, the or each said pass being relatively slow and containing a plurality of relatively fast sweeps whereby at least a portion of the beam ions bypass the substrate holder and any substrate thereon during at least one part of each sweep.

21. An apparatus as claimed in claim 20, in which the substrate holder is a rotatable wheel having an axis of rotation and a plurality of radially spaced substrates supported upon spokes spaced radially around the wheel, said wheel axis being mounted for reciprocating motion transverse to said beam direction to provide said relatively slow passes as rotation of the wheel provides said relatively fast sweeps.

22. An ion implanter as claimed in claim 14, wherein the implanter is operative to perform a plurality of said scans to complete an implant, and said controller is responsive to signals from the detector to measure said base beam current for each said scan, and said beam instability monitor is operative to detect and measure beam instability events for each said scan.

23. An ion implanter as claimed in claim 22, wherein said controller is arranged to provide data defining an accumulated dose distribution map after each one of said scans, and is further arranged to monitor said accumulated dose distribution map data after each scan to forecast whether a desired final dose uniformity value for the complete implant will be achieved.

24. An ion implanter as claimed in claim 23, wherein the controller is further arranged to generate an operator alert if said accumulated dose distribution map data forecasts that said desired final dose uniformity will not be achieved.

25. An ion implanter as claimed in claim 24, wherein the controller is further arranged to halt the implant after a scan for which the subsequent accumulated dose distribution map data forecasts that the desired final dose uniformity will not be achieved.

26. An ion implanter as claimed in claim 14, having a source of ions at a source potential, a mass selector structure at a base potential and a process chamber containing said substrate holder at a target potential, wherein said beam instability monitor is responsive to the total current returning to the mass selector structure which is required to maintain the substrate holder at the target potential.

\* \* \* \* \*